（12）United States Patent
Cabral et al.

(10) Patent No.: US 9,379,156 B2
(45) Date of Patent: Jun. 28, 2016

(54) PER-CHANNEL IMAGE INTENSITY CORRECTION

(75) Inventors: Brian Cabral, San Jose, CA (US); Hu He, Santa Clara, CA (US); Elena Ing, Santa Clara, CA (US); Sohei Takemoto, Fremont, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 810 days.

(21) Appl. No.: 12/101,142

(22) Filed: Apr. 10, 2008

(65) Prior Publication Data

US 2009/0257677 A1    Oct. 15, 2009

(51) Int. Cl.
G06K 9/40 (2006.01)
H01L 27/146 (2006.01)

(52) U.S. Cl.
CPC ................ H01L 27/14627 (2013.01)

(58) Field of Classification Search
USPC ......... 382/162, 167, 199, 129, 232, 173, 205, 382/274; 375/E7.137, E7.166; 348/234, 348/228.1, 229.1; 358/518, 523; 356/496; 379/90.01; 362/574; 396/429
See application file for complete search history.

(56) References Cited

U.S. PATENT DOCUMENTS

| | | | |
|---|---|---|---|
| 3,904,818 A | 9/1975 | Kovac | |
| 4,253,120 A | 2/1981 | Levine | |
| 4,646,251 A | 2/1987 | Hayes et al. | |
| 4,685,071 A | 8/1987 | Lee | |
| 4,739,495 A | 4/1988 | Levine | |
| 4,771,470 A | 9/1988 | Geiser et al. | |
| 4,920,428 A | 4/1990 | Lin et al. | |
| 4,987,496 A | 1/1991 | Greivenkamp, Jr. | |
| 5,175,430 A | 12/1992 | Enke et al. | |
| 5,261,029 A | 11/1993 | Abi-Ezzi et al. | |
| 5,305,994 A | 4/1994 | Matsui et al. | |
| 5,387,983 A | 2/1995 | Sugiura et al. | |
| 5,475,430 A | 12/1995 | Hamada et al. | |
| 5,513,016 A | 4/1996 | Inoue | |
| 5,608,824 A | 3/1997 | Shimizu et al. | |
| 5,652,621 A | 7/1997 | Adams, Jr. et al. | |
| 5,793,433 A | 8/1998 | Kim et al. | |
| 5,878,174 A | 3/1999 | Stewart et al. | |
| 5,903,273 A | 5/1999 | Mochizuki et al. | |
| 5,905,530 A | 5/1999 | Yokota et al. | |
| 5,995,109 A | 11/1999 | Goel et al. | |
| 6,016,474 A | 1/2000 | Kim et al. | |
| 6,078,331 A | 6/2000 | Pulli et al. | |
| 6,111,988 A | 8/2000 | Horowitz et al. | |
| 6,118,547 A | 9/2000 | Tanioka | |

(Continued)

FOREIGN PATENT DOCUMENTS

| | | |
|---|---|---|
| CN | 1275870 | 12/2000 |
| EP | 0392565 | 10/1990 |

(Continued)

OTHER PUBLICATIONS

D. Doo, M. Sabin, "Behaviour of Recursive Division Surfaces Near Extraordinary Points", Sep. 1978; Computer Aided Design; vol. 10; pp. 356-360.

(Continued)

*Primary Examiner* — Anh Hong Do

(57) ABSTRACT

Techniques for per-channel image intensity correction includes linear interpolation of each channel of spectral data to generate corrected spectral data.

20 Claims, 8 Drawing Sheets

(56) References Cited

U.S. PATENT DOCUMENTS

| | | | |
|---|---|---|---|
| 6,128,000 A | 10/2000 | Jouppi et al. |
| 6,141,740 A | 10/2000 | Mahalingaiah et al. |
| 6,151,457 A | 11/2000 | Kawamoto |
| 6,175,430 B1 | 1/2001 | Ito |
| 6,252,611 B1 | 6/2001 | Kondo |
| 6,256,038 B1 | 7/2001 | Krishnamurthy |
| 6,281,931 B1 | 8/2001 | Tsao et al. |
| 6,289,103 B1 | 9/2001 | Sako et al. |
| 6,314,493 B1 | 11/2001 | Luick |
| 6,319,682 B1 | 11/2001 | Hochman |
| 6,323,934 B1 | 11/2001 | Enomoto |
| 6,392,216 B1 | 5/2002 | Peng-Tan |
| 6,396,397 B1 | 5/2002 | Bos et al. |
| 6,438,664 B1 | 8/2002 | McGrath et al. |
| 6,469,707 B1 | 10/2002 | Voorhies |
| 6,486,971 B1 | 11/2002 | Kawamoto |
| 6,504,952 B1 | 1/2003 | Takemura et al. |
| 6,584,202 B1 | 6/2003 | Montag et al. |
| 6,594,388 B1 | 7/2003 | Gindele et al. |
| 6,683,643 B1 | 1/2004 | Takayama et al. |
| 6,707,452 B1 | 3/2004 | Veach |
| 6,724,423 B1 | 4/2004 | Sudo |
| 6,724,932 B1 | 4/2004 | Ito |
| 6,737,625 B2 | 5/2004 | Baharav et al. |
| 6,760,080 B1 | 7/2004 | Moddel et al. |
| 6,785,814 B1 | 8/2004 | Usami et al. |
| 6,806,452 B2 | 10/2004 | Bos et al. |
| 6,839,062 B2 | 1/2005 | Aronson et al. |
| 6,856,441 B2 | 2/2005 | Zhang et al. |
| 6,891,543 B2 | 5/2005 | Wyatt |
| 6,900,836 B2 | 5/2005 | Hamilton, Jr. |
| 6,950,099 B2 | 9/2005 | Stollnitz et al. |
| 7,009,639 B1 | 3/2006 | Une et al. |
| 7,015,909 B1 | 3/2006 | Morgan, III et al. |
| 7,023,479 B2 | 4/2006 | Hiramatsu et al. |
| 7,088,388 B2 * | 8/2006 | MacLean et al. ............ 348/234 |
| 7,092,018 B1 | 8/2006 | Watanabe |
| 7,106,368 B2 | 9/2006 | Daiku et al. |
| 7,133,041 B2 | 11/2006 | Kaufman et al. |
| 7,133,072 B2 | 11/2006 | Harada |
| 7,146,041 B2 | 12/2006 | Takahashi |
| 7,221,779 B2 | 5/2007 | Kawakami et al. |
| 7,227,586 B2 | 6/2007 | Finlayson et al. |
| 7,245,319 B1 | 7/2007 | Enomoto |
| 7,305,148 B2 | 12/2007 | Spampinato et al. |
| 7,343,040 B2 | 3/2008 | Chanas |
| 7,486,844 B2 | 2/2009 | Chang et al. |
| 7,502,505 B2 | 3/2009 | Malvar et al. |
| 7,580,070 B2 | 8/2009 | Yanof et al. |
| 7,626,612 B2 | 12/2009 | John et al. |
| 7,627,193 B2 | 12/2009 | Alon et al. |
| 7,671,910 B2 | 3/2010 | Lee |
| 7,728,880 B2 | 6/2010 | Hung et al. |
| 7,750,956 B2 | 7/2010 | Wloka |
| 7,817,187 B2 | 10/2010 | Silsby et al. |
| 7,859,568 B2 | 12/2010 | Shimano et al. |
| 7,860,382 B2 | 12/2010 | Grip |
| 7,912,279 B2 | 3/2011 | Hsu et al. |
| 8,049,789 B2 | 11/2011 | Innocent |
| 8,238,695 B1 | 8/2012 | Davey et al. |
| 8,456,547 B2 | 6/2013 | Wloka |
| 8,456,548 B2 | 6/2013 | Wloka |
| 8,456,549 B2 | 6/2013 | Wloka |
| 8,471,852 B1 | 6/2013 | Bunnell |
| 2001/0001234 A1 | 5/2001 | Addy et al. |
| 2001/0012113 A1 | 8/2001 | Yoshizawa et al. |
| 2001/0012127 A1 | 8/2001 | Fukuda et al. |
| 2001/0015821 A1 | 8/2001 | Namizuka et al. |
| 2001/0019429 A1 | 9/2001 | Oteki et al. |
| 2001/0021278 A1 | 9/2001 | Fukuda et al. |
| 2001/0033410 A1 | 10/2001 | Helsel et al. |
| 2001/0050778 A1 | 12/2001 | Fukuda et al. |
| 2001/0054126 A1 | 12/2001 | Fukuda et al. |
| 2002/0012131 A1 | 1/2002 | Oteki et al. |
| 2002/0015111 A1 | 2/2002 | Harada |
| 2002/0018244 A1 | 2/2002 | Namizuka et al. |
| 2002/0027670 A1 | 3/2002 | Takahashi et al. |
| 2002/0033887 A1 | 3/2002 | Hieda et al. |
| 2002/0041383 A1 | 4/2002 | Lewis, Jr. et al. |
| 2002/0044778 A1 | 4/2002 | Suzuki |
| 2002/0054374 A1 | 5/2002 | Inoue et al. |
| 2002/0063802 A1 | 5/2002 | Gullichsen et al. |
| 2002/0105579 A1 | 8/2002 | Levine et al. |
| 2002/0126210 A1 | 9/2002 | Shinohara et al. |
| 2002/0146136 A1 | 10/2002 | Carter, Jr. |
| 2002/0149683 A1 | 10/2002 | Post |
| 2002/0158971 A1 | 10/2002 | Daiku et al. |
| 2002/0167202 A1 | 11/2002 | Pfalzgraf |
| 2002/0167602 A1 | 11/2002 | Nguyen |
| 2002/0191694 A1 | 12/2002 | Ohyama et al. |
| 2002/0196470 A1 | 12/2002 | Kawamoto et al. |
| 2003/0035100 A1 | 2/2003 | Dimsdale et al. |
| 2003/0067461 A1 | 4/2003 | Fletcher et al. |
| 2003/0122825 A1 | 7/2003 | Kawamoto |
| 2003/0142222 A1 | 7/2003 | Hordley |
| 2003/0146975 A1 | 8/2003 | Joung et al. |
| 2003/0169353 A1 | 9/2003 | Keshet et al. |
| 2003/0169918 A1 | 9/2003 | Sogawa |
| 2003/0197701 A1 | 10/2003 | Teodosiadis et al. |
| 2003/0218672 A1 | 11/2003 | Zhang et al. |
| 2003/0222995 A1 | 12/2003 | Kaplinsky et al. |
| 2003/0223007 A1 | 12/2003 | Takane |
| 2004/0001061 A1 | 1/2004 | Stollnitz et al. |
| 2004/0001234 A1 | 1/2004 | Curry et al. |
| 2004/0032516 A1 | 2/2004 | Kakarala |
| 2004/0066970 A1 | 4/2004 | Matsugu |
| 2004/0100588 A1 | 5/2004 | Hartson et al. |
| 2004/0101313 A1 | 5/2004 | Akiyama |
| 2004/0109069 A1 | 6/2004 | Kaplinsky et al. |
| 2004/0189875 A1 | 9/2004 | Zhai et al. |
| 2004/0218071 A1 | 11/2004 | Chauville |
| 2004/0247196 A1 | 12/2004 | Chanas et al. |
| 2005/0007378 A1 | 1/2005 | Grove |
| 2005/0007477 A1 | 1/2005 | Ahiska |
| 2005/0030395 A1 | 2/2005 | Hattori |
| 2005/0046704 A1 | 3/2005 | Kinoshita |
| 2005/0099418 A1 | 5/2005 | Cabral et al. |
| 2005/0111110 A1 | 5/2005 | Matama |
| 2005/0175257 A1 | 8/2005 | Kuroki |
| 2005/0185058 A1 | 8/2005 | Sablak |
| 2005/0238225 A1 | 10/2005 | Jo et al. |
| 2005/0243181 A1 | 11/2005 | Castello et al. |
| 2005/0248671 A1 | 11/2005 | Schweng |
| 2005/0261849 A1 | 11/2005 | Kochi et al. |
| 2005/0286097 A1 | 12/2005 | Hung et al. |
| 2006/0050158 A1 | 3/2006 | Irie |
| 2006/0061658 A1 | 3/2006 | Faulkner et al. |
| 2006/0087509 A1 | 4/2006 | Ebert et al. |
| 2006/0119710 A1 | 6/2006 | Ben-Ezra et al. |
| 2006/0133697 A1 | 6/2006 | Uvarov |
| 2006/0176375 A1 | 8/2006 | Hwang et al. |
| 2006/0197664 A1 | 9/2006 | Zhang et al. |
| 2006/0274171 A1 | 12/2006 | Wang |
| 2006/0290794 A1 | 12/2006 | Bergman et al. |
| 2006/0293089 A1 | 12/2006 | Herberger et al. |
| 2007/0091188 A1 | 4/2007 | Chen et al. |
| 2007/0147706 A1 | 6/2007 | Sasaki et al. |
| 2007/0171288 A1 | 7/2007 | Inoue et al. |
| 2007/0236770 A1 | 10/2007 | Doherty et al. |
| 2007/0247532 A1 | 10/2007 | Sasaki |
| 2007/0285530 A1 | 12/2007 | Kim et al. |
| 2008/0030587 A1 | 2/2008 | Helbing |
| 2008/0043024 A1 | 2/2008 | Schiwietz et al. |
| 2008/0062164 A1 | 3/2008 | Bassi et al. |
| 2008/0101690 A1 | 5/2008 | Hsu et al. |
| 2008/0143844 A1 | 6/2008 | Innocent |
| 2008/0231726 A1 | 9/2008 | John |
| 2009/0002517 A1 | 1/2009 | Yokomitsu et al. |
| 2009/0010539 A1 | 1/2009 | Guarnera et al. |
| 2009/0037774 A1 | 2/2009 | Rideout et al. |
| 2009/0116750 A1 | 5/2009 | Lee et al. |
| 2009/0128575 A1 | 5/2009 | Liao et al. |

(56) References Cited

U.S. PATENT DOCUMENTS

| | | |
|---|---|---|
| 2009/0160957 A1 | 6/2009 | Deng et al. |
| 2009/0257677 A1 | 10/2009 | Cabral et al. |
| 2010/0266201 A1 | 10/2010 | Cabral et al. |

FOREIGN PATENT DOCUMENTS

| | | |
|---|---|---|
| EP | 1449169 | 5/2003 |
| EP | 1378790 | 7/2004 |
| EP | 1447977 | 8/2004 |
| EP | 1550980 | 7/2005 |
| GB | 2045026 | 10/1980 |
| GB | 2363018 | 12/2001 |
| JP | 61187467 | 8/1986 |
| JP | 62-151978 | 7/1987 |
| JP | 07-015631 | 1/1995 |
| JP | 8036640 | 2/1996 |
| JP | 08-079622 | 3/1996 |
| JP | 2000516752 | 12/2000 |
| JP | 2000516752 A | 12/2000 |
| JP | 2001-052194 | 2/2001 |
| JP | 2003-085542 | 3/2002 |
| JP | 2002-207242 | 7/2002 |
| JP | 2004-221838 | 8/2004 |
| JP | 2005094048 | 4/2005 |
| JP | 2005-182785 | 7/2005 |
| JP | 2005520442 | 7/2005 |
| JP | 2006025005 | 1/2006 |
| JP | 2006086822 | 3/2006 |
| JP | 2006-094494 | 4/2006 |
| JP | 2006-121612 | 5/2006 |
| JP | 2006-134157 | 5/2006 |
| JP | 2007019959 | 1/2007 |
| JP | 2007-148500 | 6/2007 |
| JP | 2007-233833 | 9/2007 |
| JP | 2007282158 | 10/2007 |
| JP | 2008-085388 | 4/2008 |
| JP | 2008113416 | 5/2008 |
| JP | 2008113416 A2 | 5/2008 |
| JP | 2008-277926 | 11/2008 |
| JP | 2009021962 | 1/2009 |
| KR | 10-2004-0043156 | 5/2004 |
| KR | 1020060068497 | 6/2006 |
| KR | 1020070004202 | 1/2007 |
| WO | 03043308 | 5/2003 |
| WO | 2004063989 | 7/2004 |
| WO | 2007056459 | 5/2007 |
| WO | WO2007/093864 | 8/2007 |

OTHER PUBLICATIONS

D. W. H. Doo, "A Subdivision Algorithm for Smoothing Down Irregular Shaped Polyhedrons", 1978; Interactive Techniques in Computer Aided Design; pp. 157-165.
Davis, J., Marschner, S., Garr, M., Levoy, M., Filling Holes in Complex Surfaces Using Volumetric Diffusion, Dec. 2001, Stanford University, pp. 1-9.
E. Catmull, J. Clark, "Recursively Generated B-Spline Surfaces on Arbitrary Topological Meshes", Nov. 1978I Computer Aided Design; vol. 10; pp. 350-355.
J. Bolz, P. Schroder, Rapid Evaluation of Catmull-Clark Subdivision Surfaces:, Web 3D '02.
J. Stam, "Exact Evaluation of Catmull-Clark Subdivision Surfaces At Arbitrary Parameter Values", Jul. 1998; Computer Graphics; vol. 32; pp. 395-404.
Krus, M., Bourdot, P., Osorio, A., Guisnel, F., Thibault, G.; "Adaptive Tessellation of Connected Primitives for Interactive Walkthroughs in Complex Industrial Virtual Environments", Jun. 1999, Proceedings of the Eurographics Workshop, pp. 1-10.
Kumar, S., Manocha, D., "Interactive Display of Large Scale Trimmed NURBS Models", 1994, University of North Carolina at Chapel Hill, Technical Report, pp. 1-36.
Loop, C., DeRose, T., "Generalized B-Spline Surfaces of Arbitrary Topology", Aug. 1990, Sigraph 90; pp. 347-356.
M. Halstead, M. Kass, T. DeRose, "Efficient, Fair Interpoloation Using Catmull-Clark Surfaces", Sep. 1993; Computer Graphics and Interactive Techniques, Proc; pp. 35-44.
T. DeRose, M. Kass, T. Truong; "Subdivision Surfaces in Character Animation", Jul. 1998; Computer Graphics and Interactive Techniques Proc, pp. 85-94.
Takeuchi, S., Kanai, T., Suzuki, H., Shimada, K., Kimura, F., "Subdivision Surface Fitting With QEM-Based Mesh SImplification and Reconstruction of Approximated B-Spline Surfaces", 2000, Eighth Pacific Conference on Computer Graphics and Applicaitons, pp. 202-212.
"A Pipelined Architecture for Real-Time Correction of Barrel Distortion in Wide-Angle Camera Images", Hau, T. Ngo, Student Member, IEEE and Vijayan K. Asari, Senior Member IEEE, IEEE Transaction on Circuits and Systems for Video Technology: vol. 15 No. 3 Mar. 2005 pp. 436-444.
"Calibration and removal of lateral chromatic aberration in images" Mallon, et al. Science Direct Copyright 2006; 11 pages.
"Method of Color Interpolation in a Single Sensor Color Camera Using Green Channel Seperation" Weerasighe, et al Visual Information Processing Lab, Motorola Austrailan Research Center pp. IV-3233-IV3236, 2002.
http://Slashdot.org/articles/07/09/06/1431217.html.
http:englishrussia.com/?p=1377 unknown date.
Kuno et al. "New Interpolation Method Using Discriminated Color Correlation for Digital Still Cameras" IEEE Transac. On Consumer Electronics, vol. 45, No. 1, Feb. 1999, pp. 259-267.
gDEBugger, graphicRemedy, http://www.grennedy.com, Aug. 8, 2006, pp. 1-18.
Parhami, Computer Arithmetic, Oxford University Press, Jun. 2000, pp. 413-418.
Duca et al., "A Relational Debugging Engine for Graphics Pipeline, International Conference on Computer Graphics and Interactive Techniques", ACM SIGGRAPH Jul. 2005, pp. 453-463.
Keith R. Slavin; Application as Filed entitled "Efficient Method for Reducing Noise and Blur in a Composite Still Image From a Rolling Shutter Camera"; U.S. Appl. No. 12/069,669, filed Feb. 11, 2008.
Donald D. Spencer, "Illustrated Computer Graphics Dictionary", 1993, Camelot Publishing Company, p. 272.
http://en.wikipedia.org/wiki/Bayer_filter; "Bayer Filter"; Wikipedia, the free encyclopedia; pp. 1-4.
http://en.wikipedia.org/wiki/Color_filter_array; "Color Filter Array"; Wikipedia, the free encyclopedia; pp. 1-5.
http://en.wikipedia.org/wiki/Color_space; "Color Space"; Wikipedia, the free encyclopedia; pp. 1-4.
http://en.wikipedia.org/wiki/Color_translation; "Color Management"; Wikipedia, the free encyclopedia; pp. 1-4.
http://en.wikipedia.org/wiki/Demosaicing; "Demosaicing"; Wikipedia, the free encyclopedia; pp. 1-5.
http://en.wikipedia.org/wiki/Half_tone; "Halftone"; Wikipedia, the free encyclopedia; pp. 1-5.
http://en.wikipedia.org/wiki/L*a*b*; "Lab Color Space"; Wikipedia, the free encyclopedia; pp. 1-4.
Ko et al., "Fast Digital Image Stabilizer Based on Gray-Coded Bit-Plane Matching", IEEE Transactions on Consumer Electronics, vol. 45, No. 3, pp. 598-603, Aug. 1999.
Ko, et al., "Digital Image Stabilizing Algorithms Basd on Bit-Plane Matching", IEEE Transactions on Consumer Electronics, vol. 44, No. 3, pp. 617-622, Aug. 1988.
Morimoto et al., "Fast Electronic Digital Image Stabilization for Off-Road Navigation", Computer Vision Laboratory, Center for Automated Research University of Maryland, Real-Time Imaging, vol. 2, pp. 285-296, 1996.
Paik et al., "An Adaptive Motion Decision system for Digital Image Stabilizer Based on Edge Pattern Matching", IEEE Transactions on Consumer Electronics, vol. 38, No. 3, pp. 607-616, Aug. 1992.
S. Erturk, "Digital Image Stabilization with Sub-Image Phase Correlation Based Global Motion Estimation", IEEE Transactions on Consumer Electronics, vol. 49, No. 4, pp. 1320-1325, Nov. 2003.
S. Erturk, "Real-Time Digital Image Stabilization Using Kalman Filters", http://www,ideallibrary.com, Real-Time Imaging 8, pp. 317-328, 2002.

(56) References Cited

OTHER PUBLICATIONS

Uomori et al., "Automatic Image Stabilizing System by Full-Digital Signal Processing", vol. 36, No. 3, pp. 510-519, Aug. 1990.
Uomori et al., "Electronic Image Stabiliztion System For Video Cameras And VCRS", J. Soc. Motion Pict. Telev. Eng., vol. 101, pp. 66-75, 1992.
Weerasinghe et al.; "Method of Color Interpolation in a Single Sensor Color Camera Using Green Channel Separation"; Visual Information Proessing lab, Motorola Australian Research Center; IV 3233-IV3236.
Goshtasby, Ardeshir, "Correction of Image Distortion From Lens Distortion Using Bezier Patches", 1989, Computer Vision, Graphics and Image Processing, vol. 47, pp. 358-394.

* cited by examiner

Legend:  Red   Green   Blue

PER-CHANNEL IMAGE INTENSITY CORRECTION

BACKGROUND OF THE INVENTION

Computing devices have made significant contributions toward the advancement of modern society and are utilized in a number of applications to achieve advantageous results. Numerous devices, such as digital cameras, computers, game consoles, video equipment, hand-held computing devices, audio devices, telephones, and navigation systems have facilitated increased productivity and reduced costs in communicating and analyzing data in most areas of entertainment, education, business and science. The digital camera and camcorders, for example, has become popular for personal use and for use in business.

FIG. 1 shows an exemplary digital camera according to the conventional art. The digital camera 100 typically includes one or more lenses 110, one or more image sensor arrays 130, an analog-to-digital converter (ADC) 140, a digital signal processor (DSP) 150 and one or more computing device readable media 160. The image sensor 130 includes a two-dimension array of hundreds, thousand, millions or more of imaging sensors, which each convert light (e.g. photons) into electrons. The array of sensor cells are typically arranged in a pattern of red, green and blue cells The image sensor 130 may be a charge coupled device (CCD), complementary metal oxide semiconductor (CMOS) device, or the like. Referring now to FIG. 2, an exemplary Bayer CMOS sensor array is illustrated. In the array, rows of red and green sensor cells 210, 220 are interleaved with rows of blue and green sensor cells 230, 240. In a CMOS sensor array, the sensor cells are separated by sense lines 250, 260. In CCD arrays, sense lines are not formed between the rows and/or columns of cells, therefore the cells are formed right next to each other.

A continual issue when dealing with cameras and other optical devices is the distortion introduced by the lens, image sensor arrays and the like of the camera itself. Many different kinds of distortion can occur, and are familiar problems for camera designers and photographers alike.

Several approaches are traditionally used, when correcting distortion. In more expensive cameras, such as single-lens reflex (SLR) cameras, combinations of lenses are used in sequence, with each additional piece of glass often designed to reduce or eliminate a particular type of distortion. Less expensive cameras offer correspondingly fewer hardware fixes for the distortion introduced by their lenses, with integrated solutions, such as mobile phone cameras, having almost no inherent distortion correction.

Distortion can also be corrected after an image has been captured. Digital imagery, such as the pictures and video captured by digital cameras and camcorders, can be manipulated after the image has been taken, and the distortion introduced by the camera itself can be reduced.

Referring again to FIG. 1, light coming through the lens 110 and forming an image of on the image sensor 130 will typically be unevenly attenuated across the image plane and color spectrum due to imperfections in the lens 110, filter 120 and image sensor 130. Therefore, the DSP 150 applies a high order two-dimensional polynomial interpolation across the image plane. The two-dimensional polynomial f(x,y), however, can be expensive to calculate and use. Furthermore, the two-dimensional polynomial are often numerically unstable and posses other undesirable properties. Accordingly, there is a continuing need for improved imaging processing techniques that provide image intensity correction.

SUMMARY OF THE INVENTION

Embodiments of the present technology are directed toward techniques for per-channel image intensity correction. In one embodiment, a method of performing per channel image intensity correction includes receiving spectral data for a given image. Linear interpolation is applied to each channel of the spectral data to generate corrected spectral data for the given image. The corrected spectral data for the given image may then be output for storage on computing device readable media, for further processing, or the like.

In another embodiment, an imaging system includes one or more lenses, one or more image sensor arrays and a linear interpolator. The one or more image sensor arrays measure spectral data for the given image focused on the arrays by the one or more lenses. The linear interpolator generates corrected spectral data for each channel of the spectral data of the given image.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Figure 1:
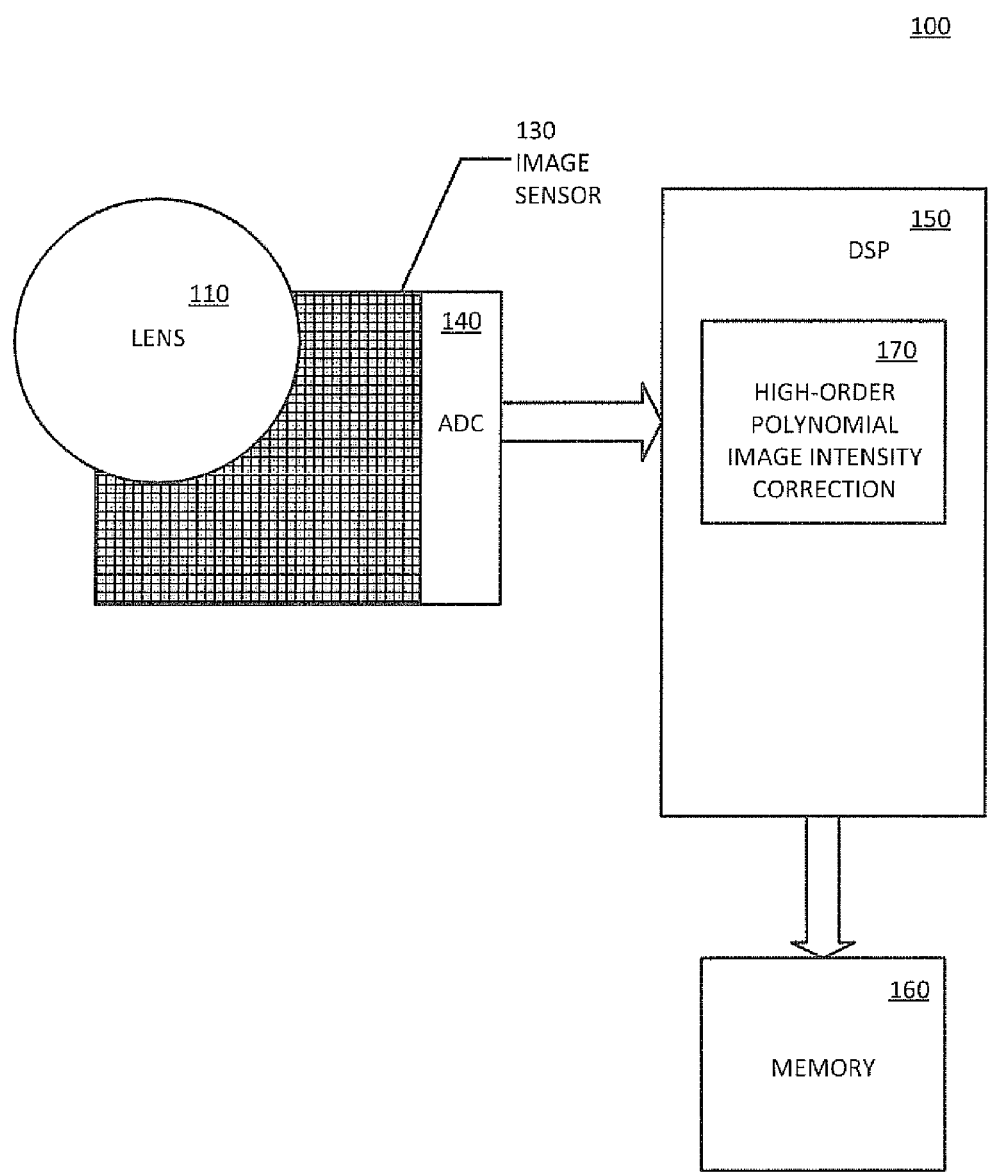
FIG. 1 shows a block diagram of an exemplary digital camera according to the conventional art.
Figure 2:
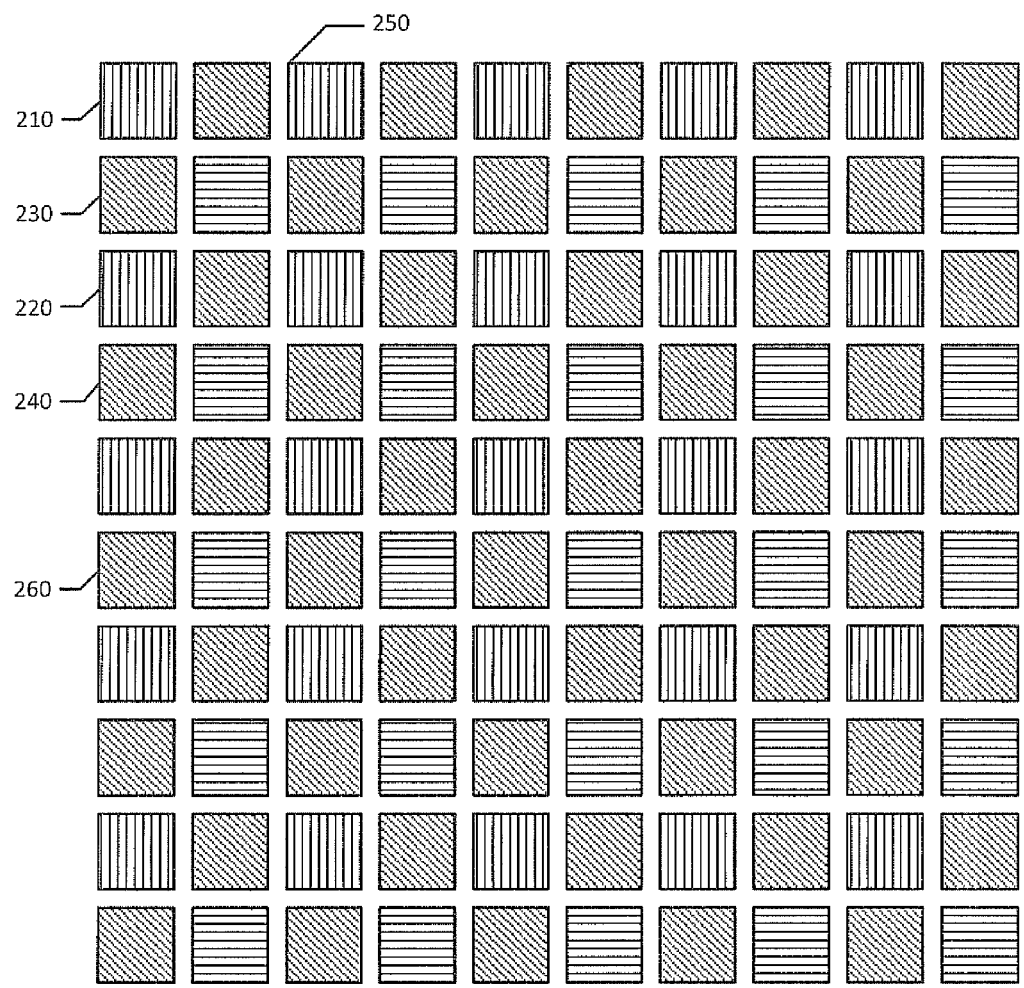
FIG. 2 shows a block diagram of an exemplary Bayer CMOS sensor array.
Figure 2:
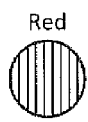
Figure 2:
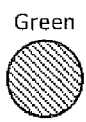
Figure 2:
Figure 3:
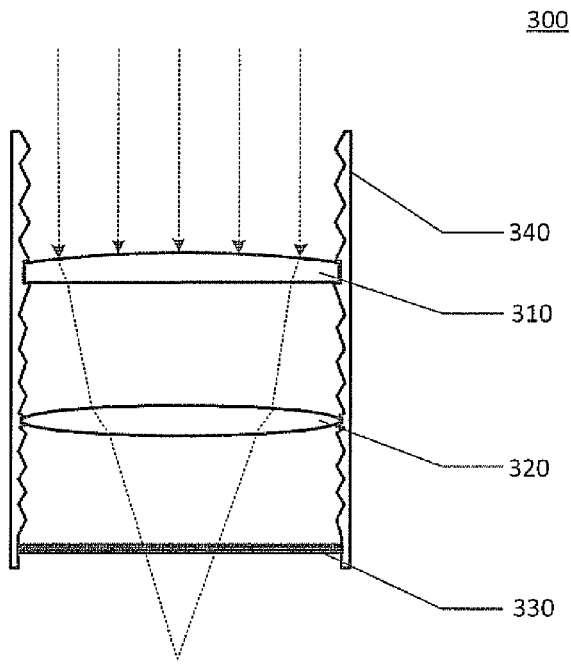
FIG. 3 shows a block diagram of an exemplary image capture portion of a digital camera or camcorder.
Figure 4:
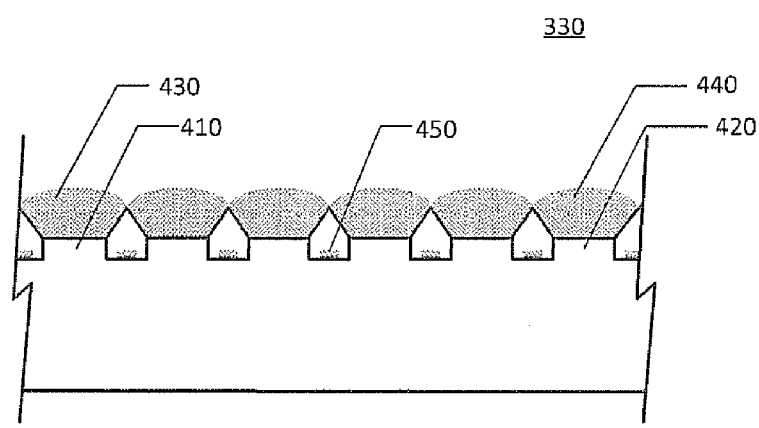
FIG. 4 shows a block diagram of an exemplary image sensor array of a digital camera or camcorder.

Referring to FIG. 3, an exemplary image capture portion 300 of a digital camera or camcorder is shown. The image capture portion 300 includes one or more lenses 310, 320, and one or more image sensors 330 mounted in an enclosure 340. The enclosure 340 holds the lenses 310, 320 and image sensors 330 in fixed relationship to each other. The enclosure 340 typically has corrugate sidewalls and fittings to hold the lenses 310, 320 and/or image sensors 330. Referring to FIG. 4, an exemplary image sensor 330 of a digital camera or camcorder is shown. The image sensor 330 includes a plurality of sensor cells 410, 420. Each cell 410, 420 detects the light (e.g., photon) intensity of a given color of light. In an exemplary Bayer image sensor, rows of red and green sensor cells are interleaved with rows of blue and green sensor cells. A CMOS type image sensor array also includes sense lines 450 formed between the rows and/or columns of cells. Therefore, the image sensor array may also include cell lens 430, 440 disposed on each cell 410, 420. In particular, cell lenses (e.g., lenticular array) having a wedge shape may be disposed on each image cell to focus the light proximate each image cell and corresponding portion of the sense line area into each corresponding image cell.

Figure 5:
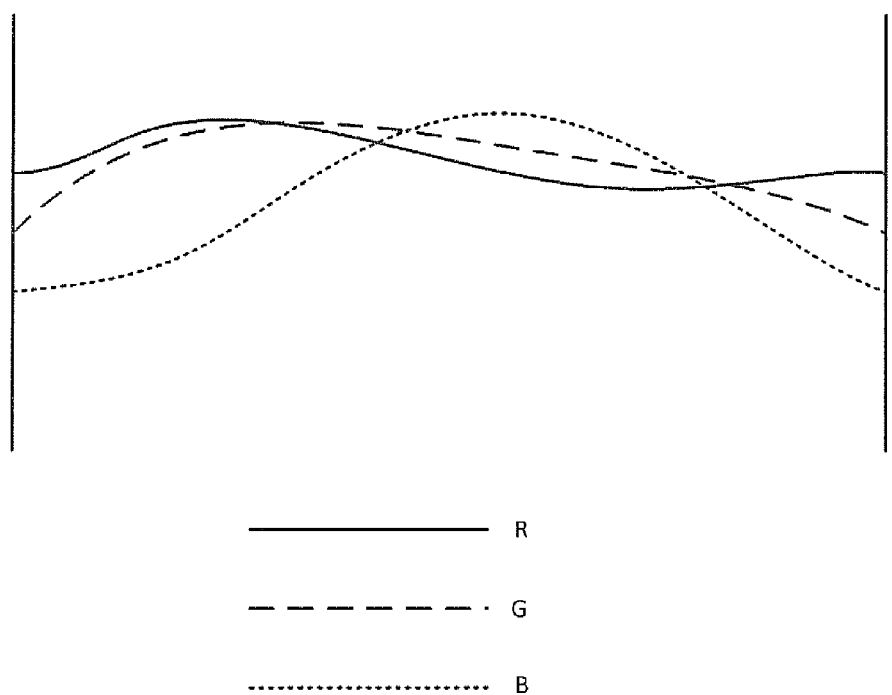
FIG. 5 shows a graph of an exemplary distortion profile across the image plane.

The corrugated sidewalls and fittings of the housing and the like tend to cause vignetting of the image at the image sensor 330. In addition, the lenses 310, 320 tend to cause distortion across the plane of the image sensor 330 and chromatic aberration as light passes through the lenses 310, 320. Chromatic aberration causes the distortion profile across the imaging plane to be shifted for each spectral channel (e.g., red, redgreen, blue and blue-green channels). The sense line regions 450 between cells 410, 420 also create distortion. Referring to FIG. 5, an exemplary distortion profile across the image plane is shown. As shown, imperfections in the lenses 310, 320, 430, 440, imperfections in the image sensors 410, 420, and vignetting of the image cause the distortion profile for each illuminant to vary. In addition, spectral aberration will also cause the distortion profile for each color to be shifted with respect to the other colors. Thus, the distortion profile is also a function of the illuminant.

Figure 6:
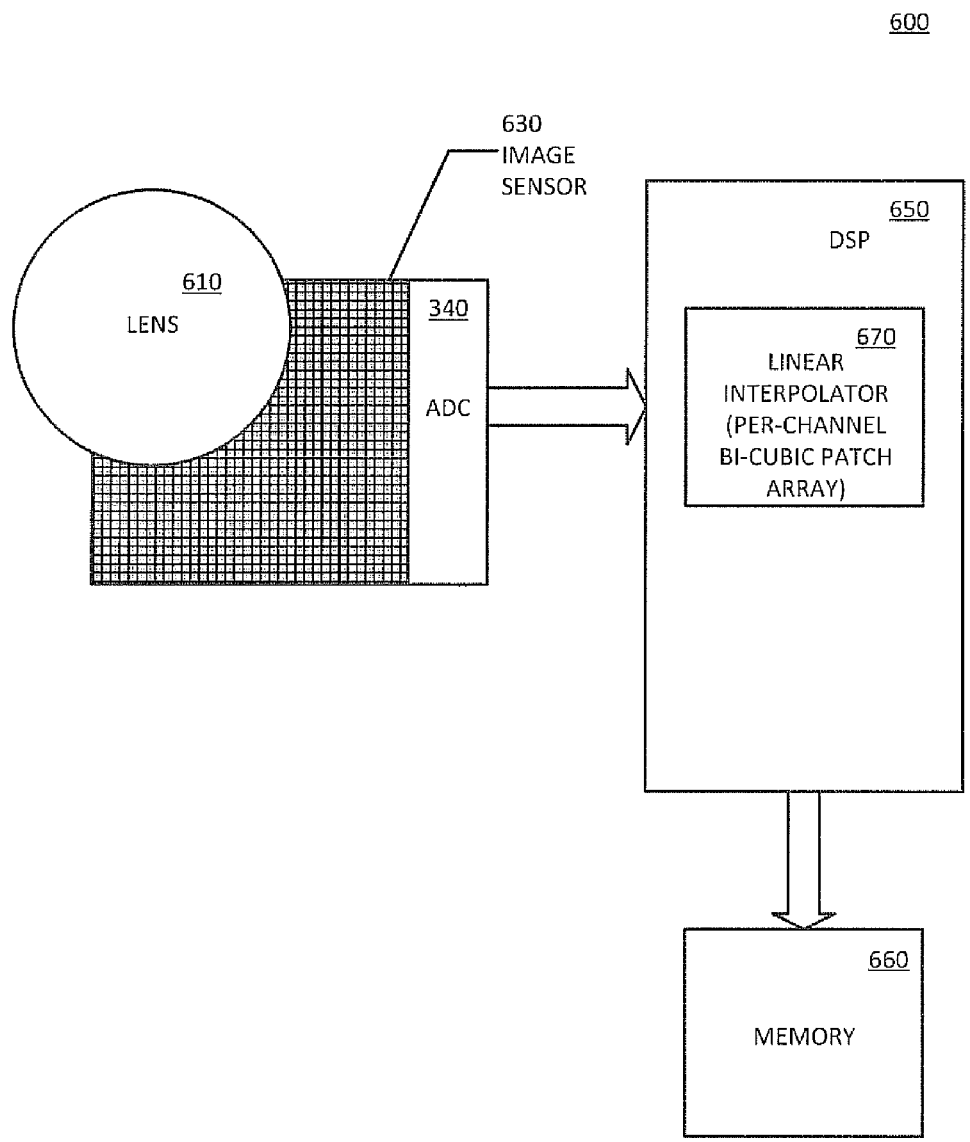
FIG. 6 shows a block diagram of an exemplary digital camera or camcorder, in accordance with one embodiment of the present technology.

Referring to FIG. 6, an exemplary digital camera or camcorder, in accordance with one embodiment of the present technology, is shown. The digital camera or camcorder includes one or more lenses 610, one or more image sensor arrays 630, an analog-to-digital converter (ADC) 640, a digital signal processor (DSP) 650 and one or more computing device readable media 660. The image sensor 630 includes a two-dimension array of hundreds, thousand, millions or more of sense cells, which each convert light (e.g. photons) into electrons. The image sensor 630 may be a charge coupled device (CCD), complementary metal oxide semiconductor (CMOS) device, or the like.

The analog-to-digital converter (ADC) 140 converts the sensed intensity of photons into corresponding digital spectral data for each of a plurality of spectral channels. The light intensity sensed by the image sensor array 630 will be unevenly attenuated across the image plane and illuminants (e.g., red, green and blue light) due to imperfections in the lens 610, imperfections in the image sensor 630, vignetting effects cause by the enclosure and/or the like. Bi-cubic patch arrays in the DSP 650 apply bi-cubic (also known as Bezier) interpolation to each spectral channel (e.g., red, green-red, blue, and green-blue channels) of the spectral data to correct for image intensity distortion across the image plane and illuminant. A set of bi-cubic patches 370 are used for each spectral channel. Bi-cubic interpolation is relatively easy to implement in hardware, as compared to two-dimensional polynomials, because the surface is affine as a function of the defining control points. Alternatively, bi-cubic interpolation may be implemented in software (e.g., instructions executing on a processor such as a CPU or GPU).

Figure 7:
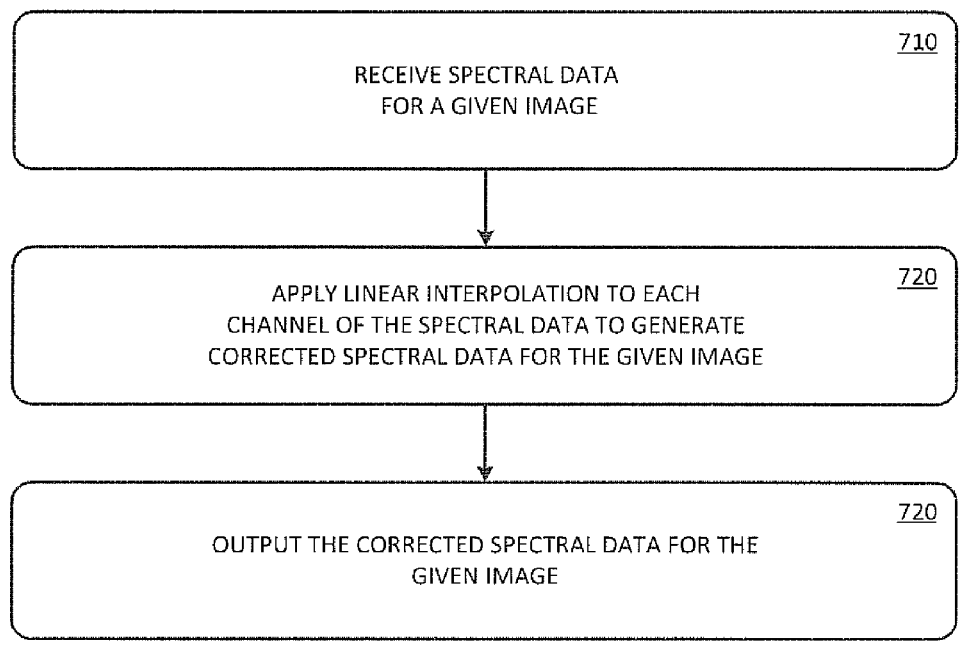
FIG. 7 shows a flow diagram of a method of performing per channel image intensity correction, in accordance with one embodiment of the present technology.

Referring now to FIG. 7, a method of performing per channel image intensity correction, in accordance with one embodiment of the present technology, is shown. The method includes receiving spectral data for a given image, at 710. The data includes a separate digital intensity data for each of a plurality of spectral channels (e.g., red, green-red, blue and green-blue) across an image plane. At 720, a general twoparameter spline, such as bi-cubic interpolation, is applied to each spectral channel of data to generate corrected spectral channel data for the given image. Bi-cubic interpolation multiplies the distortion profile surface L(x,y) by a reciprocal function S(x,y) that will make it a constant k. The correction surface function, evaluated on a per parameteric coordinate basis, is a polynomial and may have up to one hundred coefficients to approximate 10 'wiggles' in each dimension. Bicubic interpolation approximates the function using linear interpolation. The linear interpolation function is a $t+(1-a)^r$. Bi-cubic interpolation is numerically stable, as compared to two-dimensional polynomials, and posses a variety of other desirable properties. At 730, the corrected spectral channel data for the given image is output for storage in computing device readable media, further digital signal processing, and/ or the like.

Figure 8A:
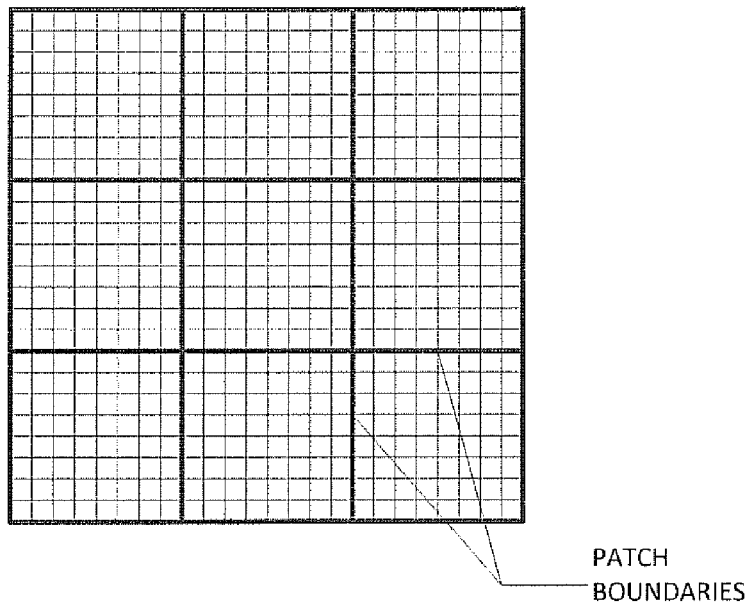
FIGS. 8A and 8B show a block diagram of an exemplary image plane (e.g., sensor array) divided into a plurality of patches.
Figure 8B:
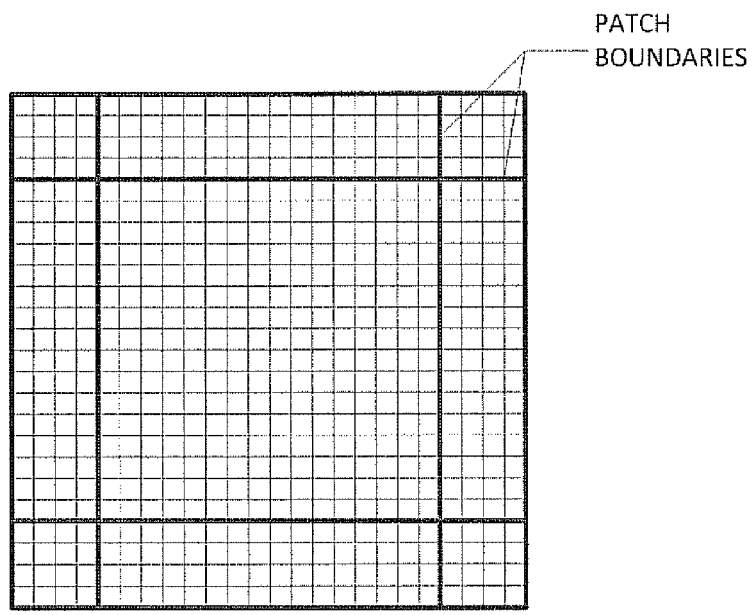

Referring now to FIGS. 8A and 8B, an exemplary image plane (e.g., sensor array) divided into a plurality of patches shown. In FIG. 8A, the image plane is divided into a plurality of patches of substantially uniform patch boundaries. In FIG. 8B, the image plane is divided into a plurality of patches with adjusted boundaries. The image plane may be divided into one, two, three or more patches in each dimension. A bi-cubic Bezier interpolating patch is defined by 16(4×4) control points. A 3×3 array of bi-cubic Bezier patches is defined by 100(10×10) array of control points. It is not (4*3)^2 since the internal patch boundaries which interpolate to control point at these boundaries share these very same control points at the boundaries. The ability to adjust the patch boundaries allow for being able to have smaller patched in particular areas of the image plane where there are more interesting distortion effects, such as at the edges of the image plane. The bi-cubit Bezier spline (e.g., third power) is evaluated in each patch for each spectral channel.

Figure 9:
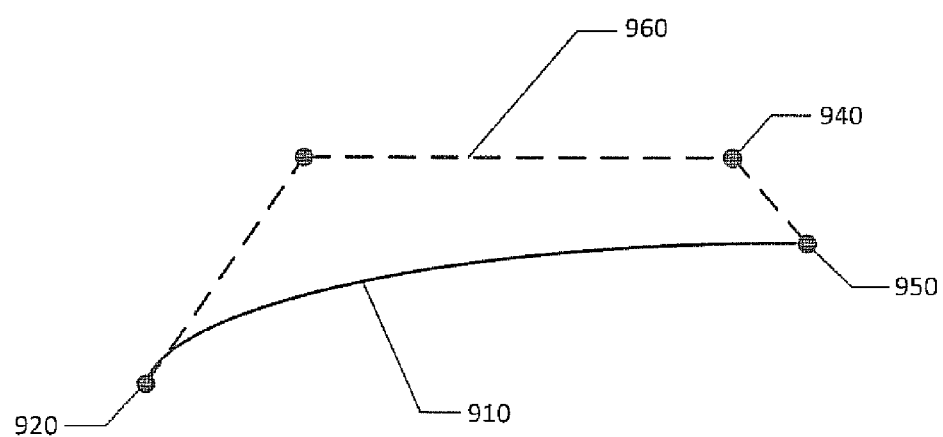
FIG. 9 shows a block diagram of a bi-cubic interpolation of an exemplary spline surface.

Referring now to FIG. 9, a bi-cubic interpolation of an exemplary spline surface 910 is shown. The bicubic interpolation is defined by four control points (e.g., coefficients) 920-950 that define a hull 960. The control hull 960 bounds where the spline curve can go, such that the surface 910 is contained in the convex hull 960. The surface 910 starts and end sat the edge control points 920, 950 and will get close to but never go through the interior control points 930, 940. The Bezier spline surface 910 does not in general pass through the interior control points 930, 940, rather the surface 920 is "stretched" toward them as though each were an attractive force. By bounding the curve a limited number of bits can be dedicated. The curve can be evaluated by a series of linear interpolations a $t+(1-a)^r$. The linear interpolation a $t+(1-a)^r$ is very easy to implement in hardware and/or software. They are visually intuitive, and mathematically convenient. The bicubic Bezier surfaces generally provide enough degrees of freedom for most applications.

A two-dimensional Bezier surface can be defined as a parametric surface where the position of a point S as a function of the parametric coordinates x,y is given by:

$$S(x, y) = \sum_{i=0}^{n} \sum_{j=0}^{m} B_n^i(x) B_m^j(y) k_{i,j}$$

evaluated over the unit square, where $$B_i^n(x) = \binom{n}{i} x^i (1-x)^{n-i}$$

is a Bernstein polynomial, and $$\binom{n}{i} = \frac{n!}{i!(n-i)!}$$

is the binomial coefficient. Bicubic interpolation on an arbitrary sized regular grid can then be accomplished by patching together such bicubic surfaces, ensuring that the derivatives match on the boundaries. If the derivatives are unkown, they may be approximated from the function values at points neighboring the corners of the unit square (e.g., using finite differences).

For each illuminant (e.g., red, green, and blue light), interpolation can be performed by sampling the entire image at many more points than coefficients (or control points) and then fitting the coefficients or control points with some fitting procedure such as linear least squares estimation. For the illuminants the interpolations are fi-invariant. Because the interpolation is fi-invariant, scaling or transforming the surface is the same as shifting and/or scaling the control points. In particular, shifting the surface is the same as shifting the control points, and scaling the surface is the same as moving the control points up or down. Therefore, as the light warms up, the coefficients do not need to be recomputed because information about the shift and scaling can be utilized. Accordingly, a calibration process may be utilized to characterize the adjustment (e.g., shift and/or scale) necessary to correct spectral data of the image.

Embodiments of the present technology are independent of the type of image sensor and can be utilized with a plurality of types of image sensor, such as Bayer arrays, an arbitrary sensor configurations including but not limited to arranging the sensor array stacked fashion or separately one for each color channel using a beam splitter, and the like. In addition, embodiment of the present technology may also be utilized in digital video cameras, as video is a series of sequential images. In addition, the camera, camcorder or image capture portion may in integrated into or attached as a peripheral device to other electronic devices such as computers, cameras, security systems and the like.

The correction per spectral channel may be performed utilizing any of a large family of spline surfaces (spline patches), such as NURB non-uniform rational B-spline, B-spline. A particular embodiment can use Bezier that can be implemented using a variety of well known techniques including recursive linear interpolation, so called de Casteljau's algorithm, or by direct application of Berstein polynomials.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the Claims appended hereto and their equivalents.

What is claimed is:

1. A method of performing per channel image intensity correction comprising:
   receiving spectral data for a given image;
   applying a general two-parameter spline to each channel of the spectral data to generate corrected spectral data for the given image; and
   outputting the corrected spectral data for the given image.

2. The method according to claim 1, wherein the general two-parameter spline comprises bi-cubic Bezier interpolation.

3. The method according to claim 1, wherein the general two-parameter spline comprises b-spline interpolation.

4. The method according to claim 1, wherein the general two-parameter spline comprises non-uniform rational b-spline interpolation.

5. The method according to claim 1, wherein the spectral data is distorted due to imperfection in one or more lenses.

6. The method according to claim 1, wherein the spectral data is distorted due to imperfection in one or more image sensor arrays.

7. The method according to claim 1, wherein the spectral data is distorted by chromatic aberration from one or more lenses.

8. The method according to claim 1, wherein the spectral data is distorted by vignetting effects.

9. The method according to claim 1, wherein parameter spline can be aggregated into a plurality of connected 2 parameter splines to form an array of 2 parameter splines.

10. The method according to claim 1, wherein said array of splines an be of any plurality in both the dimensions of the 2 parameter splines.

11. The method according to claim 1, the boundaries of the spline arrays are of arbitrary spacing and orientation and shape.

12. An imaging system comprising:
   one or more lenses;
   one or more image sensor arrays for measuring spectral data for a given image focused on the one or more image sensor arrays by the one or more lenses;
   a general two-parameter spline for generating corrected spectral data for each channel of the spectral data of the given image.

13. The imaging system of claim 12, wherein the one or more image sensor arrays are divided into a plurality of adjustable patches.

14. The imaging system of claim 12, wherein the one or more image sensor arrays comprise a complimentary metal oxide semiconductor (CMOS) device array.

15. The imaging system of claim 12, wherein the one or more image sensor arrays comprise a charge coupled device (CCD) array.

16. The imaging system of claim 12, wherein the image sensor arrays comprise a Bayer sensor array.

17. The imaging system of claim 12, wherein the image sensor arrays comprise a Foveon sensor array.

18. The imaging system of claim 12, wherein the general two-parameter spline comprises a bi-cubic patch array.

19. The imaging system of claim 12, wherein the imaging system includes a digital camera.

20. The imaging system of claim 12, wherein the imaging system includes a digital camcorder.

\* \* \* \* \*